(12) United States Patent
Shen

(10) Patent No.: US 10,826,243 B2
(45) Date of Patent: Nov. 3, 2020

(54) ELECTRIC CONNECTOR TERMINAL CONFIGURATION STRUCTURE

(71) Applicant: SURE-FIRE ELECTRICAL CORPORATION, New Taipei (TW)

(72) Inventor: Chun-Lai Shen, New Taipei (TW)

(73) Assignee: Sure-Fire Electrical Corporation, New Taipei (TW)

( * ) Notice: Subject to any disclaimer, the term of this patent is extended or adjusted under 35 U.S.C. 154(b) by 0 days.

(21) Appl. No.: 16/526,059

(22) Filed: Jul. 30, 2019

(65) Prior Publication Data

US 2020/0076133 A1 Mar. 5, 2020

Related U.S. Application Data

(63) Continuation of application No. 16/114,578, filed on Aug. 28, 2018, now abandoned.

(51) Int. Cl.
| | |
|---|---|
| *H01R 12/55* | (2011.01) |
| *H01R 13/6473* | (2011.01) |
| *H01R 13/6471* | (2011.01) |
| *H05K 1/02* | (2006.01) |
| *H01R 13/6587* | (2011.01) |

(52) U.S. Cl.
CPC ......... *H01R 13/6473* (2013.01); *H01R 12/55* (2013.01); *H01R 13/6471* (2013.01); *H05K 1/025* (2013.01); *H01R 13/6587* (2013.01); *H05K 2201/0707* (2013.01)

(58) Field of Classification Search
CPC ............................ H01R 13/6473; H01R 12/55; H01R 13/6471; H01R 13/6587; H01R 13/6466; H01R 13/6594; H01R 12/721; H01R 13/6658; H05K 1/025; H05K 2201/0707
See application file for complete search history.

(56) References Cited

U.S. PATENT DOCUMENTS

| | | | | |
|---|---|---|---|---|
| 7,824,220 | B2* | 11/2010 | Chen | H01R 13/6477 439/607.35 |
| 9,774,111 | B2* | 9/2017 | Liang | H01R 13/6469 |
| 10,476,208 | B1* | 11/2019 | Shen | H01R 12/716 |
| 2010/0184329 | A1* | 7/2010 | Hou | H01R 13/6658 439/607.01 |
| 2010/0248515 | A1* | 9/2010 | Kondo | H01R 27/00 439/218 |

(Continued)

*Primary Examiner* — Truc T Nguyen
(74) *Attorney, Agent, or Firm* — Rosenberg, Klein & Lee

(57) ABSTRACT

An electric connector terminal configuration structure includes an insulating body, a terminal set disposed inside a base of the insulating body and including conductive terminals arranged in upper and lower rows, and a circuit board connected to terminal set and including a first contact set and a second ground set. The first contact set is electrically connected to the terminal set, to transmit differential pair signals, ground signals and non-differential pair signals. The second contact set is electrically connected to the first contact set and has the same signal transmission configuration as the first contact set, and in the second contact set, an interval of contacts for transmitting differential pair signals is lower than the interval of a contact for transmitting a ground signal and an adjacent contact for transmitting the differential pair signal, to solve the high frequency impedance matching problem, thereby matching the HDMI 2.1 specification.

9 Claims, 7 Drawing Sheets

(56) References Cited

U.S. PATENT DOCUMENTS

| | | | |
|---|---|---|---|
| 2011/0143594 A1* | 6/2011 | Nagata | H01R 13/6593 |
| | | | 439/607.54 |
| 2012/0028481 A1* | 2/2012 | Saito | H04N 5/2251 |
| | | | 439/55 |
| 2012/0064758 A1* | 3/2012 | Grice | H01R 13/7175 |
| | | | 439/490 |
| 2013/0130546 A1* | 5/2013 | Wu | H01R 13/40 |
| | | | 439/604 |
| 2013/0196550 A1* | 8/2013 | Casher | H01R 12/724 |
| | | | 439/660 |
| 2014/0051288 A1* | 2/2014 | Smink | H05K 1/0253 |
| | | | 439/607.01 |
| 2014/0227911 A1* | 8/2014 | Lim | H01R 12/716 |
| | | | 439/660 |
| 2015/0289362 A1* | 10/2015 | Tanaka | H01R 13/65915 |
| | | | 174/262 |
| 2018/0175558 A1* | 6/2018 | Dai | H01R 9/035 |
| 2019/0164891 A1* | 5/2019 | Bird | H01L 23/66 |
| 2019/0296497 A1* | 9/2019 | Chang | H01R 12/725 |

* cited by examiner

ELECTRIC CONNECTOR TERMINAL CONFIGURATION STRUCTURE

This application is a Continuation of co-pending application Ser. No. 16/114,578, filed on Aug. 28, 2018, for which priority is claimed under 35 U.S.C. § 120, the entire contents of all of which are hereby incorporated by reference.

BACKGROUND OF THE INVENTION

1. Field of the Invention

The present invention relates to an electric connector terminal configuration structure, more particularly to an electrical connector terminal configuration structure in which an interval of contacts for transmitting differential pair signals in the second contact set of the circuit board is adjusted to solve the bad high frequency impedance matching problem.

2. Description of the Related Art

The High Definition Multimedia Interface (HDMI) is an all-digital video and audio transmission interface that is able to transmit uncompressed audio and video signals. The HDMI technology can be used in electronic devices such as set-top boxes, DVD players, personal computers, video games, integrated amplifiers, digital audio equipment and televisions. Furthermore, the HDMI can transmit audio and video signals at the same time and through the same wire, so it greatly simplifies the installation of system circuits. The HDMI specification has been developed from HDMI 1.1, 1.2, 1.3, 1.4, 2.0 to the latest version HDMI 2.1, and the HDMI 2.1 specification not only supports the resolution of the transmitted picture up to a maximum of 10K, but also supports the transmission of image with dynamic HDR format and the Enhanced Audio Return Channel (eARC) function to return object oriented surrounding sound signal, such as Dolby Atmos and DTS:X.

The HDMI 2.1 can increase the data transmission bandwidth to 48 Gbps, and also support transmission of image signal with 10K resolution 100/120 fps 12 bit 4:2:0 (that is, the resolution of 10,240×4,320 processed by display stream compression (DSC) technology), and natively support transmission of higher frame rate video signals of 8K 60 fps 12 bit 4:2:0 and 4K 120 fps 12 bit RGB 4:4:4. Furthermore, the HDMI 2.1 also fully supports dynamic HDR image format that can dynamically enhance image from scene to scene or from frame to frame, so that each image has optimized light and dark detail, light brightness, and light contrast.

Furthermore, the HDMI 2.1 has also made many improvements in image latency, for example, the HDMI 2.1 can support auto low latency mode (ALLM) to automatically set the optimal latency setting; and, the HDMI 2.1 also supports variable refresh rate (VRR) and quick frame transport (QFT) to reduce the latency of game screens.

Since the HDMI 2.1 can support the data transmission bandwidth up to 48 Gbps, the problem of excessive impedance and poor matching of high frequency data transmission may be amplified, and it may affect the data transmission rate. Therefore, what is needed is to develop an electrical connector terminal configuration structure to solve the high-frequency impedance matching problem.

SUMMARY OF THE INVENTION

In order to solve conventional problems, the inventor develops an electric connector terminal configuration structure according to the collected data, multiple tests and modifications, and years of research experience in the industry.

An objective of the present invention is that a circuit board connected to conductive terminals, which are arranged in upper and lower rows and included in a terminal set disposed inside a base of an insulating body, includes a first contact set and a second ground set, the first contact set is electrically connected to the terminal set and configured to transmit differential pair signals, ground signal and non-differential pair signals, the signal transmission configuration of the second contact set is the same as that of the first contact set, and in the second contact set, an interval of two contacts for transmitting the differential pair signals is lower than the interval of the contact for transmitting the ground signal and the adjacent contact for transmitting the differential pair signal, so as to solve the high frequency impedance matching problem, thereby meeting the requirement of the HDMI 2.1 specification.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
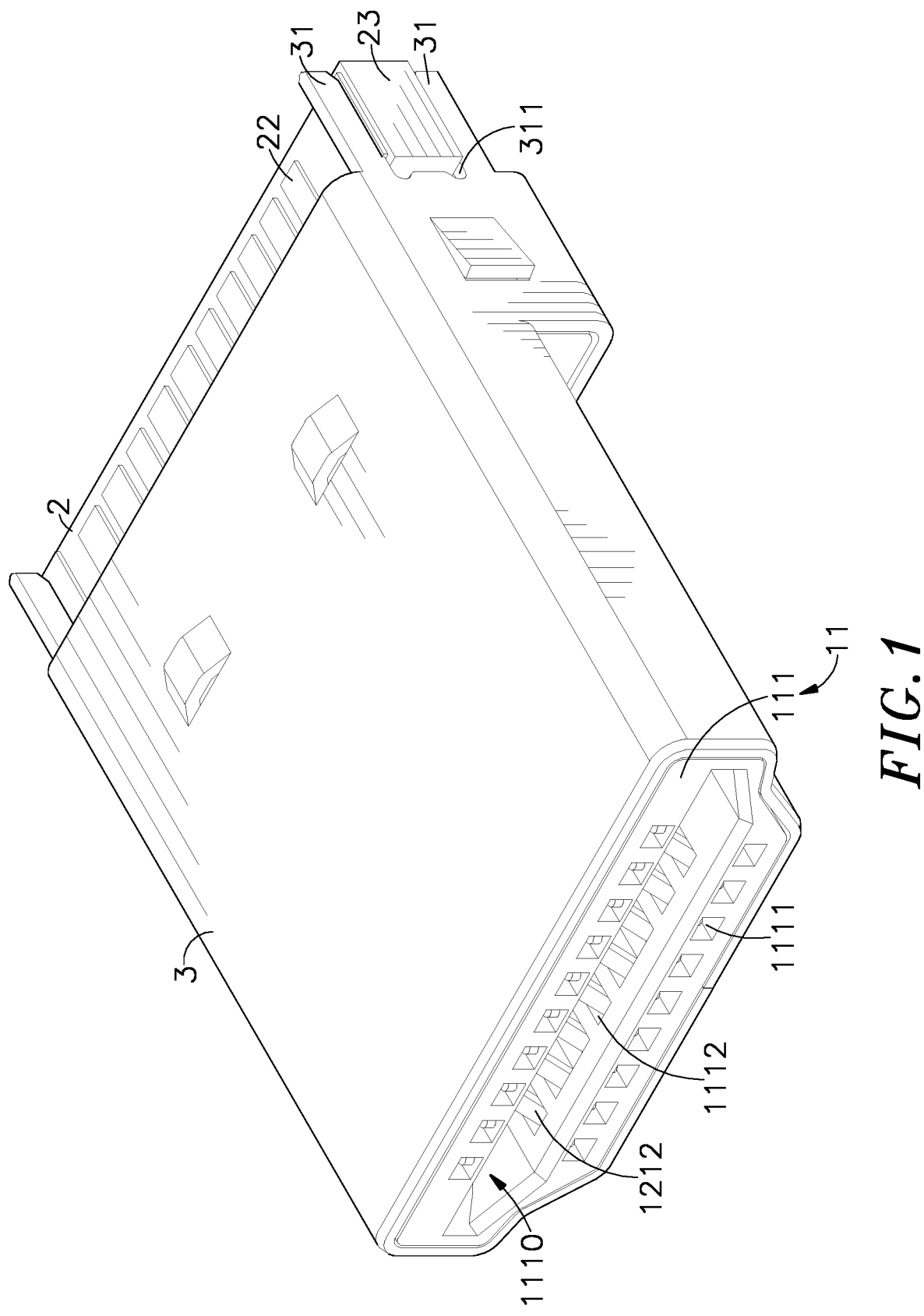
FIG. 1 is an elevational view of an electric connector of the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Please refer to FIGS. 1 to 7, which show an elevational view, an exploded view, other exploded view from another angle, a structural view of a first surface of a circuit board, a structural view of a second surface of a circuit board, a top-sectional structural view of assembly of a circuit board and an insulating body, and a bottom-sectional structural view of assembly of a circuit board and an insulating body, according to the present invention, respectively. As shown in figures, the electric connector terminal configuration structure includes an insulating body 1, a circuit board 2, and a shielding housing 3.

The insulating body 1 comprises a base 11 which includes an abutting part 111 formed at a front end thereof and a docking chamber 1110 formed inside thereof. The docking chamber 1110 has a front opening, and formed with a plurality of terminal slots 1111 disposed on upper and lower sidewalls thereof, and a plurality of hollow parts 1112 disposed on a top and a bottom thereof and between any two adjacent terminal slots 1111, respectively. The abutting part 111 also comprises narrowing surfaces 1113 downward obliquely extended from two opposite sides to a bottom thereof, respectively. The insulating body 1 includes two arms 112 suspended and extended from two opposite rear sides thereof in the same direction, and an accommodation space 1120 formed between the two arms 112. Each arm 112 comprises a plurality of guide slots 1121 recessed on an inner wall thereof from rear to front. A positioning groove 1122 is recessed between the two arms 112 and facing towards the abutting part 111, and includes buckle holes 1123 formed on upper and lower sidewalls thereof, and a plurality of channels in communication with the terminal slots 1111 corresponding thereto, respectively.

A terminal set 12 includes conductive terminals 121 disposed in upper and lower rows, and in this embodiment, base parts 1211 of the upper and lower rows of the conductive terminals 121 are be formed integrally with an upper base board 1221 and a lower base board 1222 of a terminal holder 122 by injection molding manner, respectively; however, the present invention is not limited above example, and in actual application, the upper base board 1221 and the lower base board 1222 can be combined with the upper and lower rows of the conductive terminals 121 by assembling manner, respectively, the base part 1211 of each of the upper and lower rows of the conductive terminals 121 includes a bent contact part 1212 disposed on a front portion thereof, and a solder part 1213 disposed behind the base part 1211 and inserted out of the terminal holder 122, and the upper base board 1221 includes a convex buckle 1223 disposed on a top thereof, and the lower base board 1222 includes a convex buckle 1223 disposed on a bottom thereof.

Figure 2:
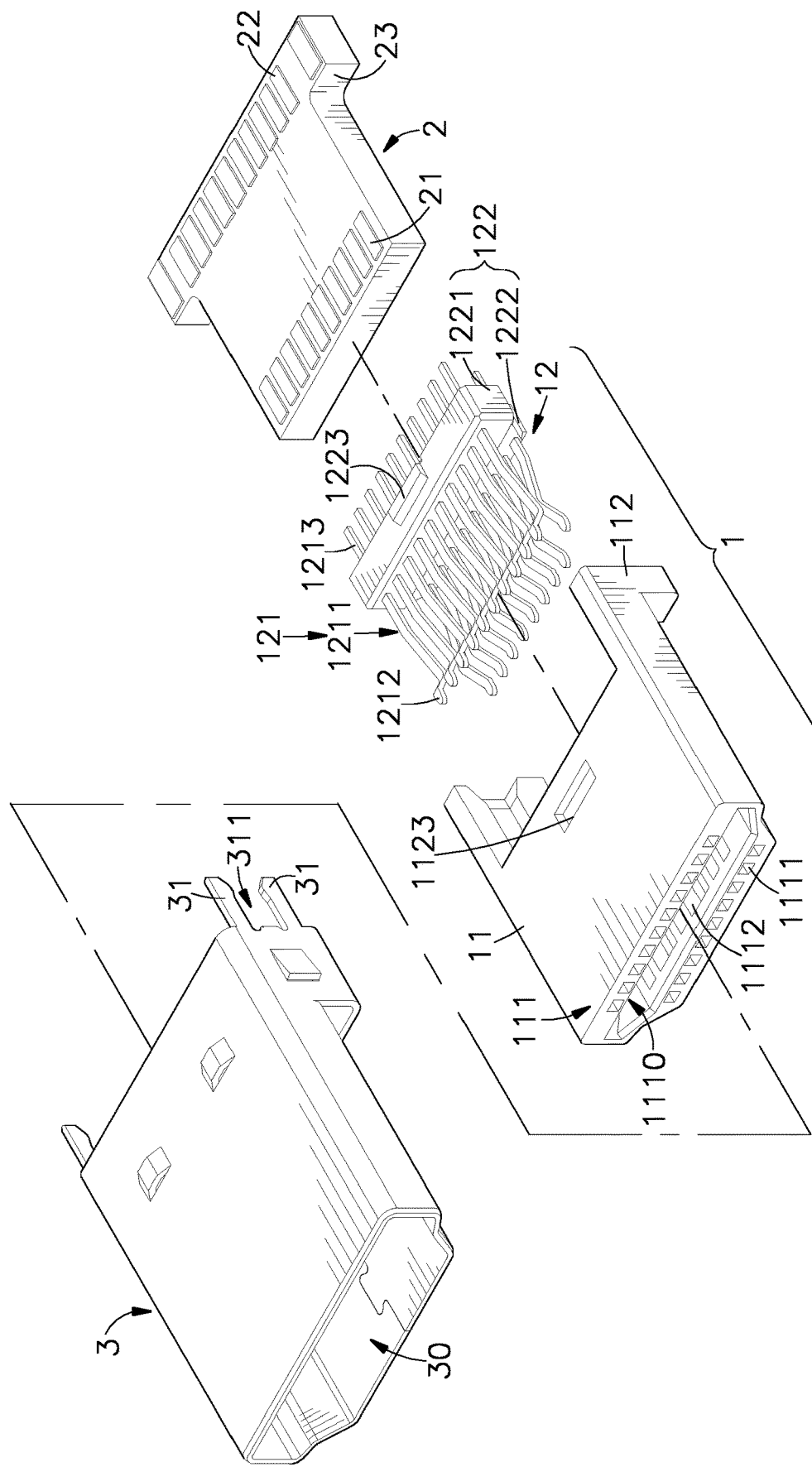
FIG. 2 is an exploded view of an electric connector of the present invention.
Figure 3:
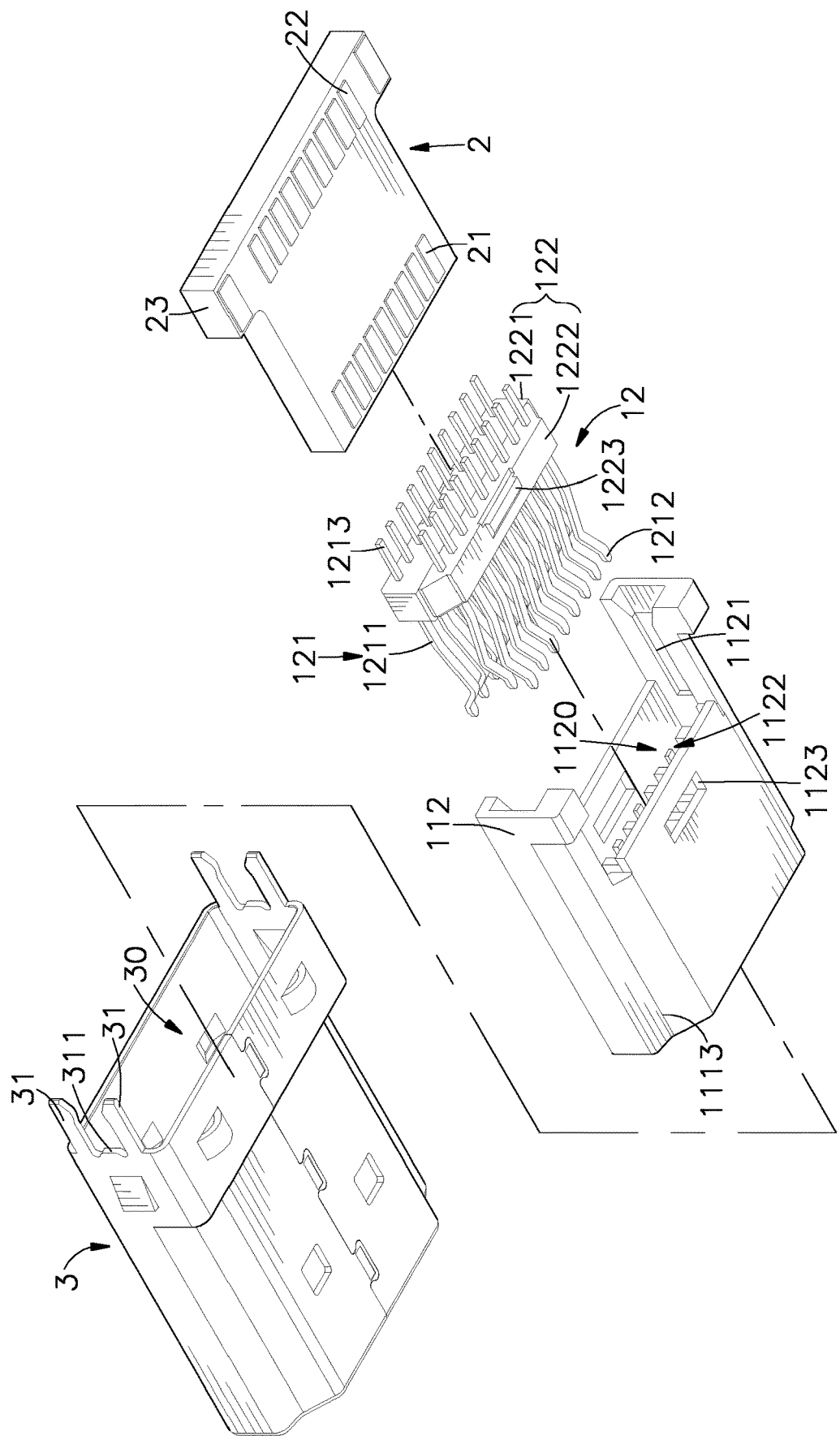
FIG. 3 is an exploded view of an electric connector of the present invention, when viewed from another angle.

Please refer to FIG. 2. The terminal set 12 includes nineteen conductive terminals 121 disposed in upper and lower rows and in horizontally misaligned arrangement. The ten conductive terminals 121 located in the upper row are defined as, in the order from left to right, a first pin served as a TMDS Data2+ pin, a third pin served as a TMDS Data2− pin, a fifth pin served as a TMDS Data1 Shield pin, a seventh pin served as a TMDS Data0+ pin, a ninth pin served as a TMDS Data0− pin, an eleventh pin served as a TMDS Clock Shield pin, a thirteenth pin served as a CEC pin, a fifteenth pin served as a SCL pin, a seventeenth pin served as a DDC/CEC Ground pin, and a nineteenth pin served as a Hot Plug Detect pin; and, the nine conductive terminals 121 located in the lower row are defined as, in the order from left to right, a second pin served as a TMDS Data2 Shield pin, a fourth pin served as a TMDS Data1+ pin, a sixth pin served as a TMDS Data1− pin, an eighth pin served as a TMDS Data0 Shield pin, a tenth pin served as a TMDS Clock+ pin, a twelfth pin served as a TMDS Clock− pin, a fourteenth pin served as a Reserved (N.C. on device) pin, a sixteenth pin served as a SDA pin, and an eighteenth pin served as a +5V Power pin. As a result, the electric connector terminal configuration structure of the present invention is able to meet the requirement of the HDMI 2.1 specification, and has the data transmission bandwidth up to 48 Gbps, and supports 4K 120 Hz, 8K 60 Hz, high-dynamic range (HDR) function, enhanced audio return channel (eARC) function, and so on.

The terminal set 12 comprises the plurality of conductive terminals 121 including a plurality of sets of differential pair terminals, a plurality of ground terminals, and a plurality of non-differential pair terminals, and each ground terminal is disposed between two adjacent sets of differential pair terminals. The plurality of sets of differential pair terminals include three sets of differential data pair terminals and a set of differential clock pair terminals. According to the pin definition of the nineteen conductive terminals 121, the first set of the differential data pair terminals includes the seventh and the ninth terminals, and the first set of the data ground terminals is the eighth terminal; the second set of the differential data pair terminals includes the fourth and the sixth terminals, and the second data ground terminal is the fifth terminal; and, the third set of the differential data pair terminals includes the first and the third terminals, and the third data ground terminal is the second terminal.

The set of the differential clock pair terminals includes the tenth and the twelfth terminals, and the ground terminal is the eleventh terminal. The non-differential pair terminals include the thirteenth to nineteenth terminal.

The circuit board 2 includes two upper and lower surfaces opposite to each other, a first contact set 21 disposed on front and rear sides of the two surfaces, and a second contact set 22 disposed behind and spaced apart from the first contact set 21. The second contact set 22 is electrically connected to the first contact set 21 through circuits disposed on the two surfaces, to form an electrical conduction path. The circuit board 2 comprises board laterals formed on two opposite sides thereof, and an abutting shoulder part 23 extended outwardly from rear portion of the two board laterals and having an increasing width, respectively. Furthermore, the circuit board 2 can be a multilayer circuit board, and the multilayer circuit board includes at least two shielding layers buried therein, so as to reduce electromagnetic wave interfere and crosstalk occurred during high frequency signal transmission. In a preferred embodiment, the multilayer circuit board can include four shielding layers buried therein.

Figure 4:
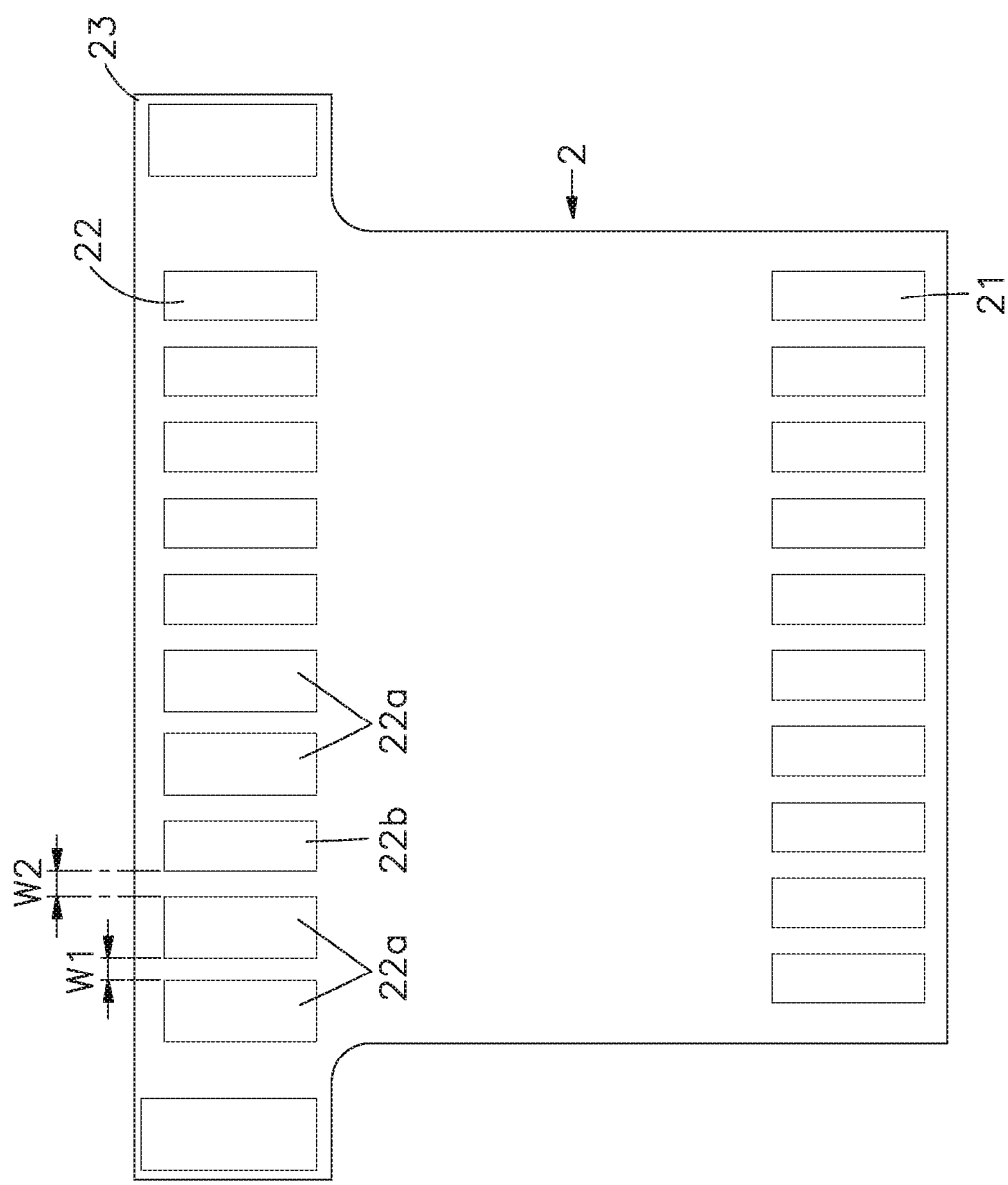
FIG. 4 is a structural view of a first surface of a circuit board of the present invention.
Figure 5:
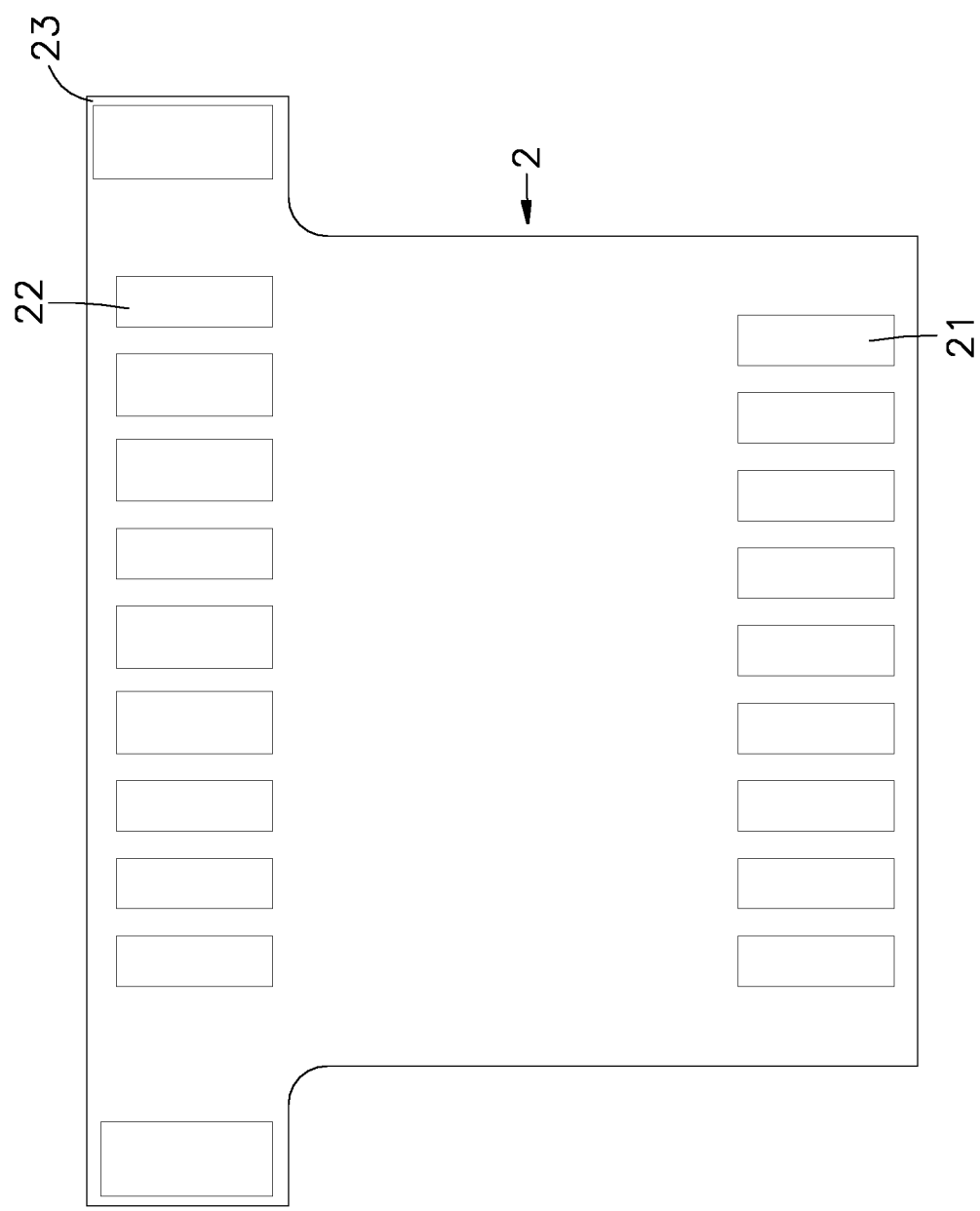
FIG. 5 is a structural view of a second surface of a circuit board of the present invention.
Figure 6:
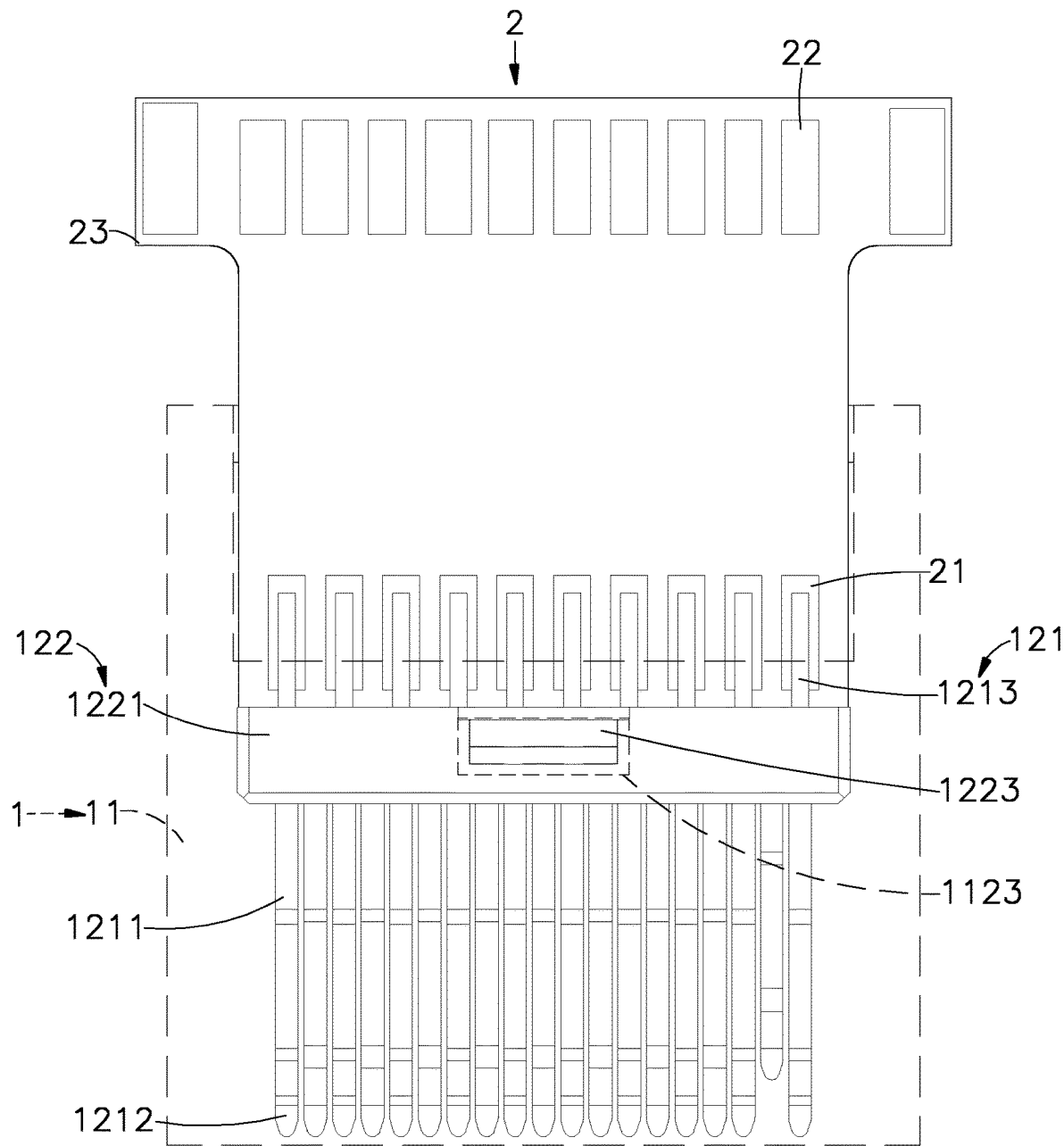
FIG. 6 is a top sectional structural view of assembly of a circuit board and an insulating body of the present invention.
Figure 7:
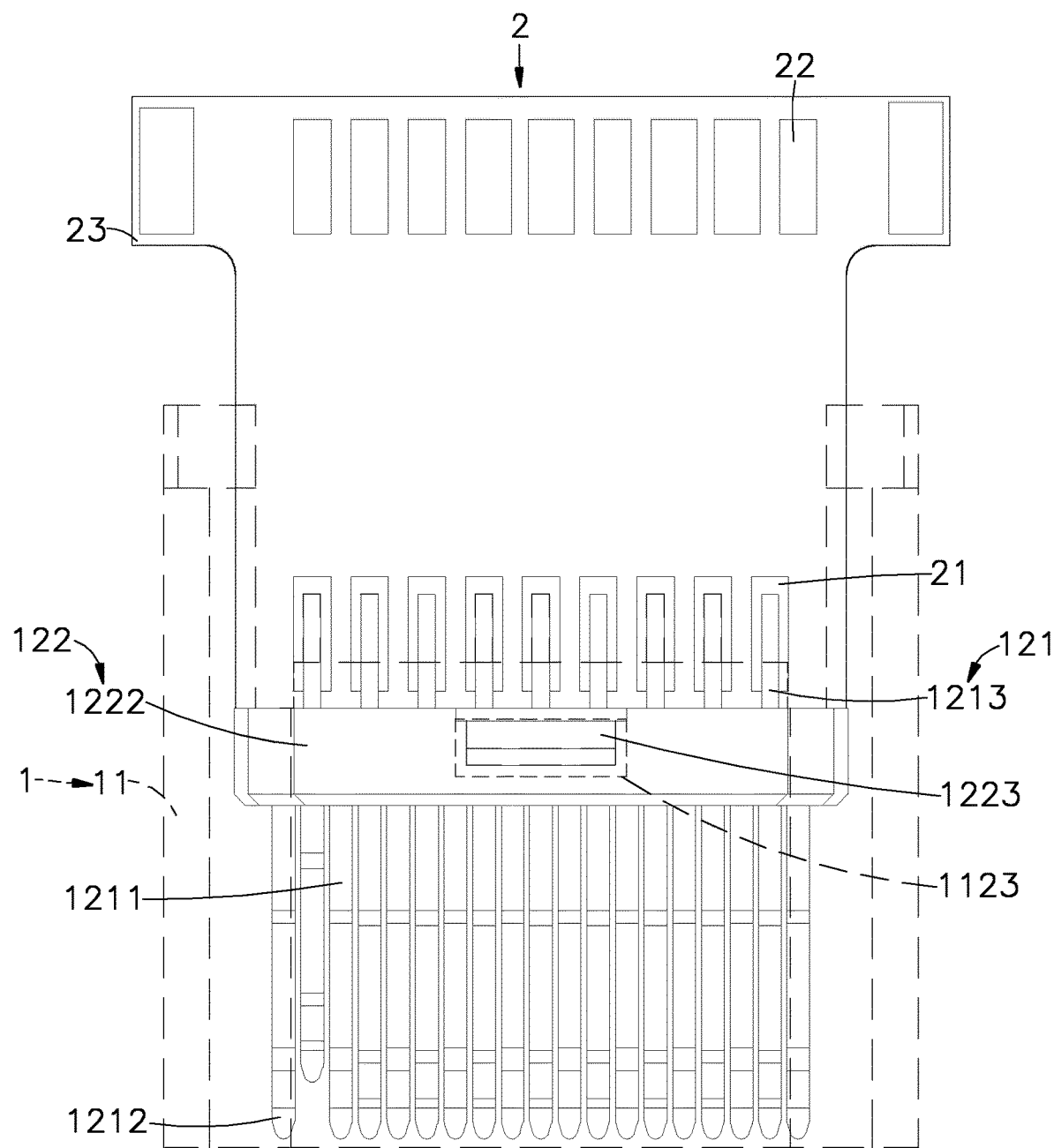
FIG. 7 is a bottom-sectional structural view of assembly of a circuit board and an insulating body of the present invention.

Please refer to FIG. 4. The first contact set 21 and the second contact set 22 are disposed on the circuit board 2, the first contact set 21 is electrically connected to the terminal set, to transmit the differential pair signals, the ground signals and the non-differential pair signals. The second contact set 22 is electrically connected to the first contact set 21 and has the same signal transmission configuration as the first contact set 21. In the second contact set 22, the interval W1 of two contacts 22a for transmitting the differential pair signals is lower than the interval W2 of a contact 22b for transmitting the ground signal and an adjacent one of the contacts 22a for transmitting the differential pair signal, such that a relationship equation of the two intervals is W1<W2. According to the pin definition of the nineteen conductive terminals 121, W1 is the interval between the two contacts electrically coupled to the first and the third terminals, the first and third terminals are the third set of the differential data pair terminals, and W2 is the interval between the two contacts electrically coupled to the third and the fifth terminals, and the third terminal is one of the third set of the differential data pair terminals, the fifth terminal is the second data ground terminals. By shortening the interval of two contacts 22a, for transmitting the differential pair signals, of the second contact set 22, to be shorter than the interval of the contact 22b for transmitting the ground signal and an adjacent one of the contacts 22a for transmitting differential pair signals, the electromagnetic field between the two differential pair signals can be counterbalanced greatly, thereby solving the poor high frequency impedance matching problem. The above-mentioned content describes an embodiment according to a set of differential data pair terminals and a ground terminal as an example, and any way of shortening the interval between the two contacts for transmitting the differential pair signals and electrically coupled to the two differential pair terminals (such as three sets of the differential data pair terminals and a set of differential clock pair terminal) to solve the bad high frequency impedance matching problem, is covered by the claim scope of the present invention.

Table one is a test data table listing the data of impedance test that the interval between second contact set electrically coupled to the two terminals of one of three sets of differential data pairs terminals and a set of differential clock pair terminals is shortened.

103.81, 105.89, 106.30, and 103.16 ohms, respectively, and these four impedance values are lower than the maximum value 115 defined in the standard specification; at the same time, the minimum impedance values obtain in the tests in the four terminals are 90.35, 89.11, 89.74, and 93.32 ohms, respectively, and these four values are higher than the minimum value 85 defined in the standard specification. As a result, the tested maximal and minimal impedance values are within the range of the minimal value to the maximal value defined in the standard specification, so the test result meets the requirement of the standard specification, and also meet the high frequency impedance matching defined in HDMI 2.1 specification. The test result also demonstrates that the method of shortening interval between second contact set electrically coupled to the two terminals of one of three sets of differential data pair terminals and a set of differential clock pair terminals can improve the high frequency impedance matching.

In an embodiment, the shielding housing 3 can be formed integrally by metal material or formed by assembling separated parts. The shielding housing 3 comprises a positioning space 30 formed inside thereof, and a front part of the positioning space 30 is in communication with a rear part of the positioning space 30. The positioning space 30 is configured to accommodate the insulating body 1, each of two opposite sides of the shielding housing 3 is formed with two ground pins 31 extended backwardly and a clamping slot 311 formed between the two ground pins 31.

In order to assemble the electric connector of the present invention, the terminal set 12 of the insulating body 1 is inserted into the base 11, the terminal holder 122 can be pushed into the accommodation space 1120 along the two arms 112 towards the positioning groove 1122, and the contact parts 1212 at the front portions of the upper and lower rows of the conductive terminals 121 are inserted through the terminal slots 1111 and into the docking chamber 1110, respectively. After the terminal holder 122 is inserted into the positioning groove 1122, the convex buckle 1223 of the terminal holder 122 can be clasped in the buckle hole 1123 for integrally combination, and the solder parts 1213 at rear portions of the upper and lower rows of the conductive terminal 121 are exposed to the accommodation space 1120. Above-mentioned assembling manner can assemble the terminal set 12 into the base 11 with one try, and the terminal set 12 can be stably blocked and positioned in the base 11, so as to prevent the terminal set 12 from dropping out of the base 11 during the connecting process.

TABLE ONE

| differential pair name | standards pecification (maximum value) | standard specification (minimum value) | test value (maximum value) | test value (minimum value) | change in test value (maximum value − minimum value) | test result |
|---|---|---|---|---|---|---|
| CLK (differential clock pair) | 115~110, 150 | 85~90, 150 | 103.81 | 90.35 | 13.46 | Pass |
| D0 (first differential data pair) | 115~110, 150 | 85~90, 150 | 105.89 | 89.11 | 16.78 | Pass |
| D1 (second differential data pair) | 115~110, 150 | 85~90, 150 | 106.30 | 89.74 | 16.56 | Pass |
| D2 (third differential data pair) | 115~110, 150 | 85~90, 150 | 103.16 | 93.32 | 9.84 | Pass |
| impedance unit | ohm | ohm | ohm | ohm | ohm | |

According to the test results, the maximal impedance values obtained in the tests for the CLK (differential clock pair), the D0 (first differential data pair), the D1 (second differential data pair), the D2 (third differential data pair) are The circuit board 2 is assembled into the base 11, the board laterals of the circuit board 2 can be pushed into the accommodation space 1120 along the guide slots 1121 of the two arms 112, and the front end of the circuit board 2 can be abutted with the terminal holder 122 of the terminal set 12, and after the solder parts 1213 of the upper and lower rows of the conductive terminals 121 are aligned to the first contact set 21 on the two surfaces, respectively, the solder parts 1213 are electrically connected to the first contact set 21 by SMT soldering manner. The arms 112 can provide guiding and constraining effect to engage the board laterals of the circuit board 2 in the guide slots 1121 of the arms 112. The structural design of the two arms 112 has advantages of simple structure and easy assembly; furthermore, the upper and lower rows of the conductive terminals 121 and the first contact set 21 of the circuit board 2 can be aligned to and soldered with each other to form electrical connection, so that the circuit board 2 can be firmly combined in the insulating body 1 without loosening or separating from the insulating body 1 easily, thereby achieving the effect of stable structure, easy assembly and lower cost.

Furthermore, the insulating body 1 can be covered and positioned by the shielding housing 3, and the insulating body 1 with the terminal set 12 and the circuit board 2 can be engaged into the positioning space 30 through the rear opening of the shielding housing 3, and after the insulating body 1 is inserted into and positioned in the shielding housing 3, the abutting shoulder part 23 at the two opposite rear sides of the circuit board 2 can be engaged in the clamping slots 311 between the ground pins 31, respectively, and the second contact set 22 of the circuit board 2 are exposed to the rear portion of the shielding housing 3, and the upper and lower ground pins 31 can be abutted with the metal contacts of the second contact set 22 corresponding thereto, respectively, and the ground pins 31 can be electrically connected to the second contact set 22 by SMT soldering manner. Besides the metal contacts, the second contact set 22 can be connected to a transmission cable, and the shielding housing 3 can also be combined with an insulating outer shell to pass through the transmission cable. It is preferable that the lengths of the insulating body 1, including the base 11 and the conductive terminals 121, and the circuit board 2 can be reduced during the manufacturing process, and the widths of the insulating body 1 and the circuit board 2 are not changed, so that after the insulating body 1 and the circuit board 2 are assembled inside the shielding housing 3, only the second contact set 22 of the circuit board 2 is exposed out of the shielding housing 3, and the shielding housing 3 can effectively shield the EMI signal generated by the insulating body 1 and the circuit board 2. As a result, the plug connector or a wire-end connector compliant with HDMI 2.1 specification can be completed.

In this embodiment, the metal contacts of the second contact set 22 of the circuit board 2 disposed on outermost side of the abutting shoulder part 23 are grounded, and after the shielding housing 3 is positioned to cover the insulating body 1, the ground pins 31 can soldered and fixed on the metal contacts of the second contact set 22 corresponding thereto, to form a common ground, respectively, so as to improve path and density of ground conduction and reduce electromagnetic wave interfere and crosstalk occurred during high frequency signal transmission; however, the present invention is not limited above example, and upon actual application or different purpose, the shielding housing 3 can be omitted. It should be noted that various equivalent structural changes, alternations or modifications based on the descriptions and figures of present disclosure are all consequently viewed as being embraced by the spirit and the scope of the present disclosure set forth in the claims.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. An electric connector terminal configuration structure, comprising:
   an insulating body including a base, and the base including a docking chamber disposed inside thereof and configured to accommodate a terminal set, wherein the terminal set includes a plurality of conductive terminals arranged in upper and lower rows in horizontally misaligned arrangement, a number of the plurality of conductive terminals is nineteen, ten of the plurality of conductive terminals are arranged in one of the upper and lower rows, and the other nine of the plurality of conductive terminals are arranged in the other of the upper and lower rows, and the plurality of conductive terminals includes a plurality of sets of differential pair terminals, a plurality of ground terminals, and a plurality of non-differential pair terminals, and each of the plurality of ground terminals is disposed between terminals for at least one set of differential pair terminals; and
   a circuit board including a first contact set and a second contact set disposed on upper and lower side surfaces thereof, wherein the second contact set is displaced from the first contact set, the first contact set is electrically connected to the terminal set and configured to transmit differential pair signals, ground signals, and non-differential pair signals, the second contact set is electrically connected to the first contact set and is matched in signal transmission configuration with the first contact set, and wherein the second contact set is configured to adjust for high frequency impedance mismatch in the terminal set, the second contact set having an interval of two contacts for transmitting differential pair signals lower than an interval of a contact for transmitting a ground signal and an adjacent one of the contacts for transmitting differential pair signals.

2. The electric connector terminal configuration structure according to claim 1, wherein the plurality of sets of differential pair terminals include three sets of differential data pair terminals and a set of differential clock pair terminals.

3. The electric connector terminal configuration structure according to claim 2, wherein a first set of the differential data pair terminals includes the seventh and the ninth terminals, and a first data ground terminal is the eighth terminal, and a second set of the differential data pair terminals includes the fourth and the sixth terminals, and a second data ground terminal is the fifth terminal, and a third set of the differential data pair terminals includes the first and the third terminals, and a third data ground terminal is the second terminal, and the set of the differential clock pair terminals includes the tenth and the twelfth terminals, and one of the ground terminals is the eleventh terminal, and the non-differential pair terminals include the thirteenth to nineteenth terminals.

4. The electric connector terminal configuration structure according to claim 1, wherein the ten conductive terminals are formed in the upper row and are defined as, in the order from left to right, a first pin served as a TMDS Data2+ pin, a third pin served as a TMDS Data2− pin, a fifth pin served as a TMDS Data1 Shield pin, a seventh pin served as a TMDS Data0+ pin, a ninth pin served as a TMDS Data0− pin, an eleventh pin served as a TMDS Clock Shield pin, a thirteenth pin served as a CEC pin, a fifteenth pin served as a SCL pin, a seventeenth pin served as a DDC/CEC Ground pin, and a nineteenth pin served as a Hot Plug Detect pin; and wherein the nine conductive terminals are formed in the lower row and defined as, in the order from left to right, a second pin served as a TMDS Data2 Shield pin, a fourth pin served as a TMDS Data1+ pin, a sixth pin served as a TMDS Data1− pin, an eighth pin served as a TMDS Data0 Shield pin, a tenth pin served as a TMDS Clock+ pin, a twelfth pin served as a TMDS Clock− pin, a fourteenth pin served as a Reserved (N.C. on device) pin, a sixteenth pin served as a SDA pin, and an eighteenth pin served as a +5V Power pin.

5. The electric connector terminal configuration structure according to claim 1, wherein the insulating body is covered and positioned by a shielding housing.

6. The electric connector terminal configuration structure according to claim 5, wherein the shielding housing is formed integrally by metal material or formed by assembling separate parts, and the shielding housing includes a positioning space formed inside thereof, and a front part of the positioning space is in communication with a rear part of the positioning space, and the positioning space is configured to accommodate the insulating body.

7. The electric connector terminal configuration structure according to claim 1, wherein the insulating body includes the base having an abutting part formed at a front end thereof, wherein the abutting part defines the docking chamber formed inside thereof and having a front opening, and the docking chamber is formed with a plurality of terminal slots disposed on upper and lower sidewalls thereof, and a plurality of hollow parts disposed on a top and a bottom thereof and between any two adjacent terminal slots of the terminal slots, respectively, and the abutting part includes narrowing surfaces downward obliquely extended from two opposite sides to a bottom thereof, respectively, and the insulating body includes two arms suspended and extended from two opposite rear sides in the same direction, respectively, and an accommodation space formed between the two arms, each of the two arms comprises a guide slot recessed on an inner walls thereof from rear to front, wherein a positioning groove is recessed between the two arms and faces towards the abutting part, and includes buckle holes formed on upper and lower sidewalls thereof, and includes a plurality of channels in communication with the terminal slots, respectively.

8. The electric connector terminal configuration structure according to claim 1, wherein the circuit board includes the first contact set disposed on front and rear sides of the two surfaces thereof, and the second contact set disposed behind and spaced apart from the first contact set, and the second contact set is electrically connected to the first contact set through a circuit disposed on the two surfaces of the circuit board, to form an electrical conduction path, and the circuit board includes board laterals formed on two opposite sides thereof, and an abutting shoulder part extended outwardly from rear portions of the two board laterals and having an increasing width.

9. The electric connector terminal configuration structure according to claim 1, wherein each of the plurality of ground terminals is disposed between two adjacent terminals of one of plurality of sets of differential pair terminals.

* * * * *